US012776384B2

(12) United States Patent
Suzuki

(10) Patent No.: US 12,776,384 B2
(45) Date of Patent: Oct. 27, 2026

(54) STORAGE DEVICE

(71) Applicant: CANON KABUSHIKI KAISHA, Tokyo (JP)

(72) Inventor: Yoshihisa Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 102 days.

(21) Appl. No.: 18/954,613

(22) Filed: Nov. 21, 2024

(65) Prior Publication Data

US 2025/0182838 A1 Jun. 5, 2025

(30) Foreign Application Priority Data

Dec. 1, 2023 (JP) ................................ 2023-203879

(51) Int. Cl.

*G11C 17/18* (2006.01)
*G11C 29/12* (2006.01)
*G11C 17/16* (2006.01)

(52) U.S. Cl.

CPC .......... *G11C 29/1201* (2013.01); *G11C 17/18* (2013.01); *G11C 29/12015* (2013.01); *G11C 17/16* (2013.01)

(58) Field of Classification Search

CPC ..... G11C 17/16; G11C 17/18; G11C 29/1201; G11C 29/12015

USPC .......................................................... 365/201

See application file for complete search history.

(56) References Cited

U.S. PATENT DOCUMENTS 7,885,117 B2 2/2011 Shin et al.
9,922,714 B1 * 3/2018 Yu .......................... G11C 16/14
2016/0118131 A1 * 4/2016 Dong ................. G11C 16/3427 365/185.02

FOREIGN PATENT DOCUMENTS

JP 2009259385 A 11/2009

* cited by examiner

*Primary Examiner* — Ly D Pham
(74) *Attorney, Agent, or Firm* — Venable LLP

(57) ABSTRACT

A storage device includes a memory unit having an antifuse element, the memory unit including a write condition storage area that stores a write condition and a write area in which information is written; and a control unit configured to perform a write operation and a read operation on the memory unit by controlling a voltage applied to the antifuse element. The control unit applies a write voltage in a form of pulses having a constant cycle to the antifuse element in the write operation, wherein the control unit controls the write condition by referring to the write condition storage area in the write operation.

7 Claims, 13 Drawing Sheets

FIG. 4

| NUMBER OF APPLIED PULSES | WRITE BITS |
|---|---|
| 10000 | 0001 |
| 20000 | 0010 |
| 30000 | 0011 |
| 40000 | 0100 |
| 50000 | 0101 |
| 60000 | 0110 |
| 70000 | 0111 |
| 80000 | 1000 |
| 90000 | 1001 |
| 100000 | 1011 |

FIG. 11

| AMBIENT TEMPERATURE | NUMBER OF WRITES |
|---|---|
| 20°C | FACTORY DEFAULT SETTING |
| 30°C | FACTORY DEFAULT SETTING + 5000 |
| 40°C | FACTORY DEFAULT SETTING + 10000 |
| 50°C | FACTORY DEFAULT SETTING + 15000 |
| 60°C | FACTORY DEFAULT SETTING + 20000 |
| 70°C | FACTORY DEFAULT SETTING + 25000 |

STORAGE DEVICE

BACKGROUND OF THE INVENTION

Field of the Invention

The present invention relates to a storage device.

Description of the Related Art

A storage device equipped with a nonvolatile memory using an antifuse in a one time programmable (OTP) unit cell has been used. There are two types of OTP nonvolatile memories, which are an OTP nonvolatile memory using a fuse element and an OTP nonvolatile memory using an antifuse element. The antifuse element can be highly integrated in structure, and a larger amount of data can be written compared to the fuse element. Further, the number of pulses and voltage needed for causing a change in the state of the antifuse element vary due to manufacturing variations in resistance value connected in parallel to the antifuse element or temperature changes due to the environment. In order to absorb the variations, the number of pulses corresponding to the worst case is commonly applied to the antifuse element. There is a technique disclosed in Japanese Patent Application Laid-open No. 2009-259385, in which the write time and the write voltage are controlled to absorb the differences in the number of pulses and the voltage needed for causing a change in the state of the antifuse element.

In Japanese Patent Application Laid-open No. 2009-259385, when writing is performed on the antifuse element of the OTP unit cell, a write operation and a read operation are performed in one cycle. Data detected in the read operation is compared with a reference value, and when the detected data is different from the reference value, the write operation time or the amplitude of the write voltage is increased.

SUMMARY OF THE INVENTION

However, in the above document, the characteristics of the antifuse element of the OTP unit cell cannot be determined at a stage before the application, and the write time and the write voltage cannot be controlled unless the write operation and the read operation are performed once. This leaves a problem in that the write time is prolonged. Compared to the conventional fuse, the antifuse element can be highly integrated in structure, and a larger amount of data can be written in the same area as the conventional area. However, the prolongation of the write time leads to a decrease in usability, which is a problem that will come to the surface in the future.

The present invention has been made in view of the above problem, and an object of the present invention is to provide write means that does not prolong the write time in a storage device having a nonvolatile memory including antifuse element.

The present invention provides a storage device comprising:

- a memory unit configured by an antifuse element, the memory unit including a write condition storage area that stores a write condition and a write area in which information is written; and
- a control unit configured to perform a write operation and a read operation on the memory unit by controlling voltage applied to the antifuse element, the control unit applying a write voltage in a form of pulses having a constant cycle to the antifuse element in the write operation,
- wherein the control unit controls the write condition by referring to the write condition storage area in the write operation.

According to the present invention, there can be provided write means that does not prolong the write time in a storage device having a nonvolatile memory including antifuse element.

Further features of the present invention will become apparent from the following description of exemplary embodiments with reference to the attached drawings.

BRIEF DESCRIPTION OF THE DRAWINGS

FIG. 4 illustrates set values of the write pulses according to Embodiment 1;

FIG. 11 illustrates set values of write pulses depending on temperatures according to Embodiment 3;

DESCRIPTION OF THE EMBODIMENTS

Hereinafter, preferred exemplary embodiments of the present invention will be described in detail with reference to the drawings. However, the dimensions, materials, shapes, relative arrangements, and the like of the constituent components described in the embodiments are not intended to limit the scope of the present invention to only those unless otherwise specified. In addition, the materials, shapes, and the like of members described once in the following description are the same as those initially described in the description thereafter unless otherwise specified. Well-known techniques or publicly known techniques in the present technical field can be applied to configurations and processes not particularly illustrated or described.

Further, redundant description may be omitted.

Embodiment 1

OTP Memory

Figure 1:
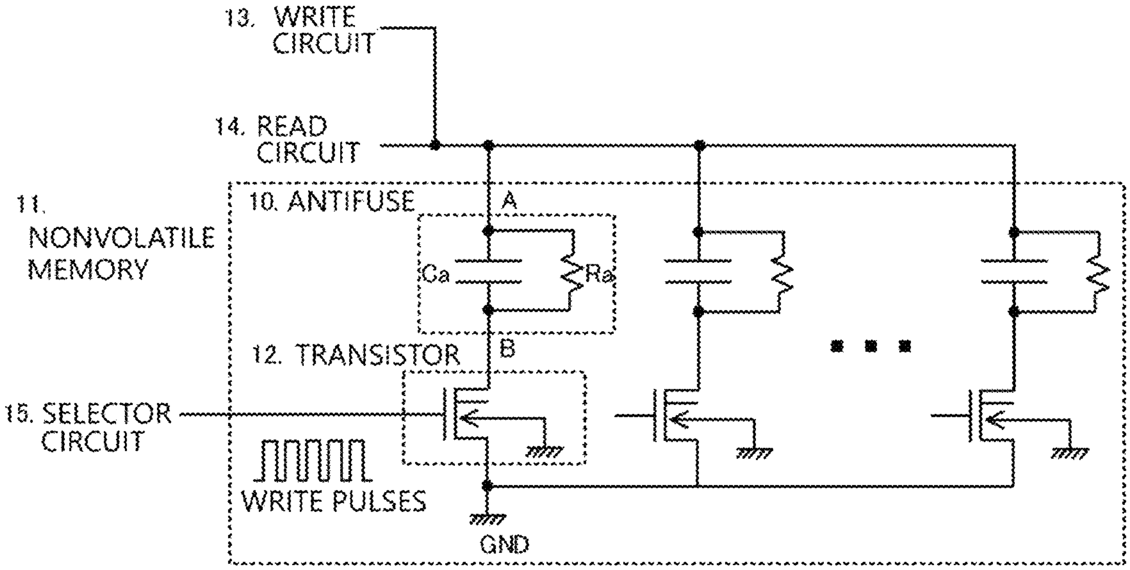
FIG. 1 illustrates an equivalent circuit representing a common nonvolatile memory using antifuse element.

A storage device of the present invention includes a common nonvolatile OTP memory 11 using antifuses 10. FIG. 1 illustrates an example of an equivalent circuit representing a state of the nonvolatile OTP memory 11 before writing is performed. The nonvolatile OTP memory 11 according to the present embodiment includes transistors 12, the antifuses 10, a write circuit 13, a selector circuit 15, and a read circuit 14.

The individual antifuse 10 includes an antifuse element Ca and a resistance element Ra. The write circuit 13 supplies power when writing is performed. The selector circuit 15 supplies a control signal to the write circuit 13 and a gate terminal of the individual transistor 12. The read circuit 14 reads the state of the antifuse element Ca. A first terminal and a second terminal are connected to an input A of the antifuse element Ca, and a source of the transistor 12 is connected to an output B. A drain terminal of the transistor 12 is connected to GND.

The antifuse element Ca is an element that has a first resistance value before information is written and has a second resistance value after information is written. The first resistance value is larger than the second resistance value, and a larger difference between the first resistance value and the second resistance value is more ideal. For example, the antifuse element Ca functions as a capacitor and has a high resistance value before information is written. However, after information is written, the antifuse element Ca exhibits a low resistance value. Since FIG. 1 illustrates the state before writing is performed to the antifuse element, the antifuse element Ca is represented as a capacitor.

Next, a write operation to the antifuse element Ca will be described. When writing is performed, switching is performed such that the write circuit 13 connected to the first terminal applies a high voltage to the antifuse element Ca. Further, a LOW-level signal is applied to the gate of the transistor 12 corresponding to the write-target antifuse element Ca. This turns on the transistor 12. As a result, a high voltage is applied to the target antifuse element Ca through the first terminal.

However, when the state of the antifuse element Ca is changed by static stress continuously applied at a constant voltage, electrons are trapped in the insulating film of the antifuse element Ca, and the state does not change in a normal manner. In order to cope with this situation, the write voltage in the form of pulses having a constant cycle, in which a LOW-level signal and a HI-level signal are alternately repeated, is commonly applied to the gate of the transistor 12. This reduces the electron trap in the insulating film of the antifuse element Ca so that the state of the antifuse element Ca can change normally.

Next, a read operation will be described. When reading is performed, a LOW-level signal is applied to the gate of the transistor 12 corresponding to the read-target antifuse 10. This turns on the transistor 12. During this state, a weak current is supplied from the read circuit 14. Since the resistance value of the antifuse element Ca differs according to whether or not information is written, the combined resistance value of the antifuse element Ca and the resistance element Ra also differs. By utilizing the difference between the resistance values caused by the state change, that is, the difference between potential differences applied to the both terminals of the antifuse 10, whether or not writing has been performed is determined.

Constituent Blocks

Figure 2:
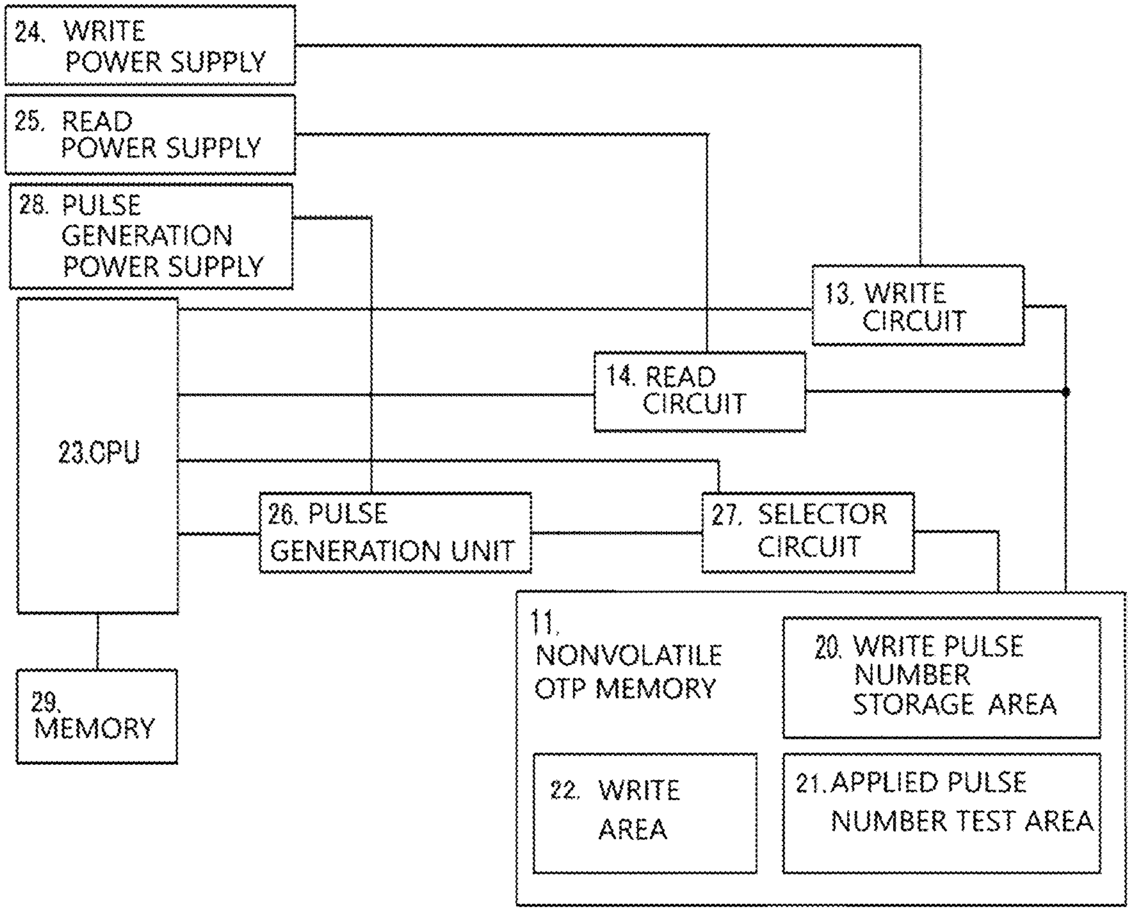
FIG. 2 is a diagram illustrating constituent blocks for write pulse determination according to Embodiment 1.

FIG. 2 is a diagram illustrating constituent blocks for determining the number of write pulses according to Embodiment 1. In the nonvolatile OTP memory 11, write conditions such as the write time, the write voltage, and the number of writes are set. The nonvolatile OTP memory 11 according to Embodiment 1 includes a write pulse number storage area 20 for storing the number of writes, which is one of the write conditions, an applied pulse number test area 21, and a write area 22. The nonvolatile OTP memory 11 is connected to the write circuit 13 and the read circuit 14 via the input A illustrated in FIG. 1.

The write circuit 13 is connected to a CPU 23 and a write power supply 24. The read circuit 14 is connected to the CPU 23 and a read power supply 25. The CPU 23 controls switching of the circuits when writing/reading is performed. When writing is performed, a high voltage is applied from the write power supply 24, and when reading is performed, a weak current is supplied from the read power supply 25. A selector circuit 27 selects the write-target/read-target antifuse 10 by switching the connection to the gate terminal of the transistor 12 corresponding to the write-target/read-target antifuse 10. The selector circuit 27 is connected to a pulse generation unit 26, and pulse signals are applied to the gate terminal of the transistor 12 via the selector circuit 27.

The selector circuit 27 is connected to the CPU 23, and the CPU 23 can control the switching. For example, when the number of applied pulses is inspected, the gate terminal of the transistor 12 corresponding to the antifuse 10 in the applied pulse number test area 21 is connected to the pulse generation unit 26. The pulse generation unit 26 is connected to a pulse generation power supply 28 and the CPU 23, and it can generate pulse signals a desired number of times by being controlled by the CPU 23. The CPU 23 is also connected to a memory 29 including a nonvolatile memory (for example, a ROM) and a volatile memory (for example, a RAM). The memory 29 stores a table of correlations between write pulses and write bits as illustrated in FIG. 4.

Pulse Determination Processing Flow

Figure 3:
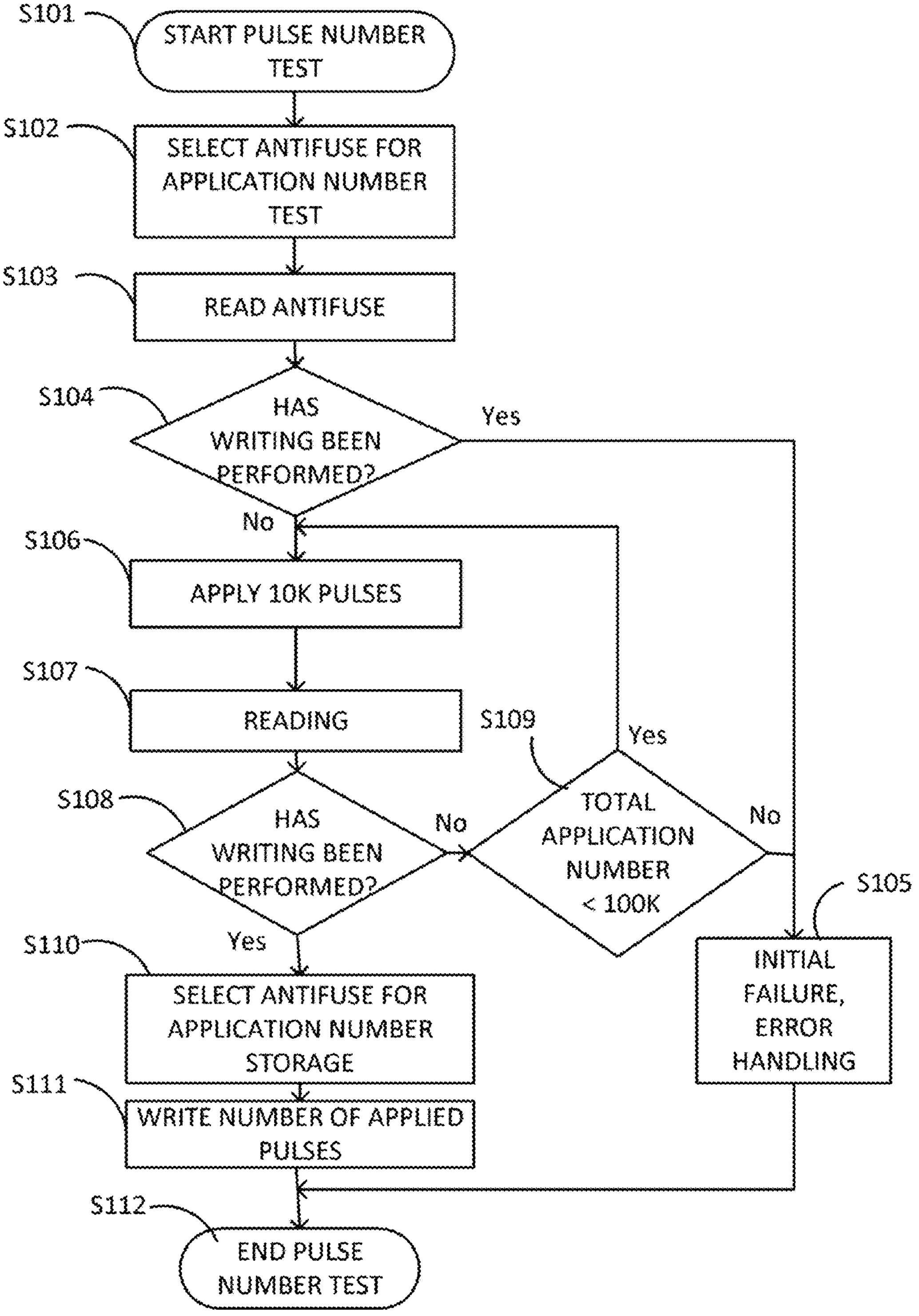
FIG. 3 is a flowchart illustrating the write pulse determination according to Embodiment 1.

FIG. 3 is a flowchart illustrating write pulse determination according to Embodiment 1. Unless otherwise specified, a control unit such as the CPU 23 acts as an agent and performs control at each step. Typically, the number of write pulses is determined in an inspection at a factory before shipping by using an antifuse element for inspection. The result of the inspection is stored in an antifuse element for storage, and writing is performed by using the information stored in the antifuse element for storage at a user site.

In step S101, the pulse number test is started. Next, in step S102, the selector circuit 27 is switched such that the antifuse 10 in the applied pulse number test area 21 is selected. Next, in step S103, the state of the antifuse 10 is read. Next, in step S104, the read state of the antifuse 10 is checked (whether or not writing has been performed).

If it is determined by the check in step S104 that the read value is at a level that is assumed to represent the state after writing, the processing proceeds to step S105. In step S105, it is determined that there is an initial failure, and error handling is performed. On the other hand, if the state of the antifuse 10 read in step S104 is at a level that is assumed to represent the state before writing, the processing proceeds to step S106. In step S106, 10 k pulses are applied. Next, in step S107, the state of the antifuse 10 is read again. Next, in step S108, it is checked whether or not there is a change in the read state of the antifuse 10.

If it is determined by the check in step S108 that there is no change in the state (no writing has been performed), the processing proceeds to step S109. In step S109, it is determined whether the total number of applied pulses exceeds 100 k pulses. If the total number of applied pulses does not exceed 100 k pulses (S109=Yes), the application of 10 k pulses (S106), the reading of the state change (S107), and the determination of the presence or absence of the state change (S108) are repeated. If the total number of applied pulses exceeds 100 k pulses, (S109=No), the processing proceeds to step S105, and error handling is performed.

In this way, the application of 10 k pulses is performed each time, and when it is determined that there is a change in the state of the antifuse 10 (the write operation is completed normally) (S108=Yes), the processing proceeds to step S110. In step S110, the selector circuit 27 is switched to a write number storage area such that the antifuse 10 in the write pulse number storage area 20 is selected. Next, in step S111, the total number of applied pulses is written by referring to the total number of pulses needed to reach the state change of the antifuse 10, and the number of write pulses and the set values in the write number storage area as illustrated in FIG. 4. Finally, in step S112, the processing ends.

The write operation according to Embodiment 1, which is performed in accordance with the number of write pulses determined in this way, will be described. As described with reference to FIG. 2, the nonvolatile OTP memory 11 includes the write pulse number storage area 20, the applied pulse number test area 21, and the write area 22, and is connected to the write circuit 13 and the read circuit 14 via the input A illustrated in FIG. 1. The CPU 23 controls the switching of the write/read circuits. When writing is performed, a high voltage is applied from the write power supply 24. The selector circuit 27 selects the write-target/read-target antifuse 10 by switching the connection between the gate terminal of the transistor 12 connected to the output B and the pulse generation unit 26. The selector circuit 27 is connected to the pulse generation unit 26 and the CPU 23, and it is controlled by the CPU 23. The pulse generation unit 26 is connected to the pulse generation power supply 28 and the CPU 23, and can generate a pulse signal a desired number of times by being controlled by the CPU 23. The CPU 23 is connected to a memory area including a table of correlations between write pulses and write bits as illustrated in FIG. 4, and it can set the number of pulses based on the result obtained by reading information in the write number storage area.

Write Operation Processing Flow

Figure 5:
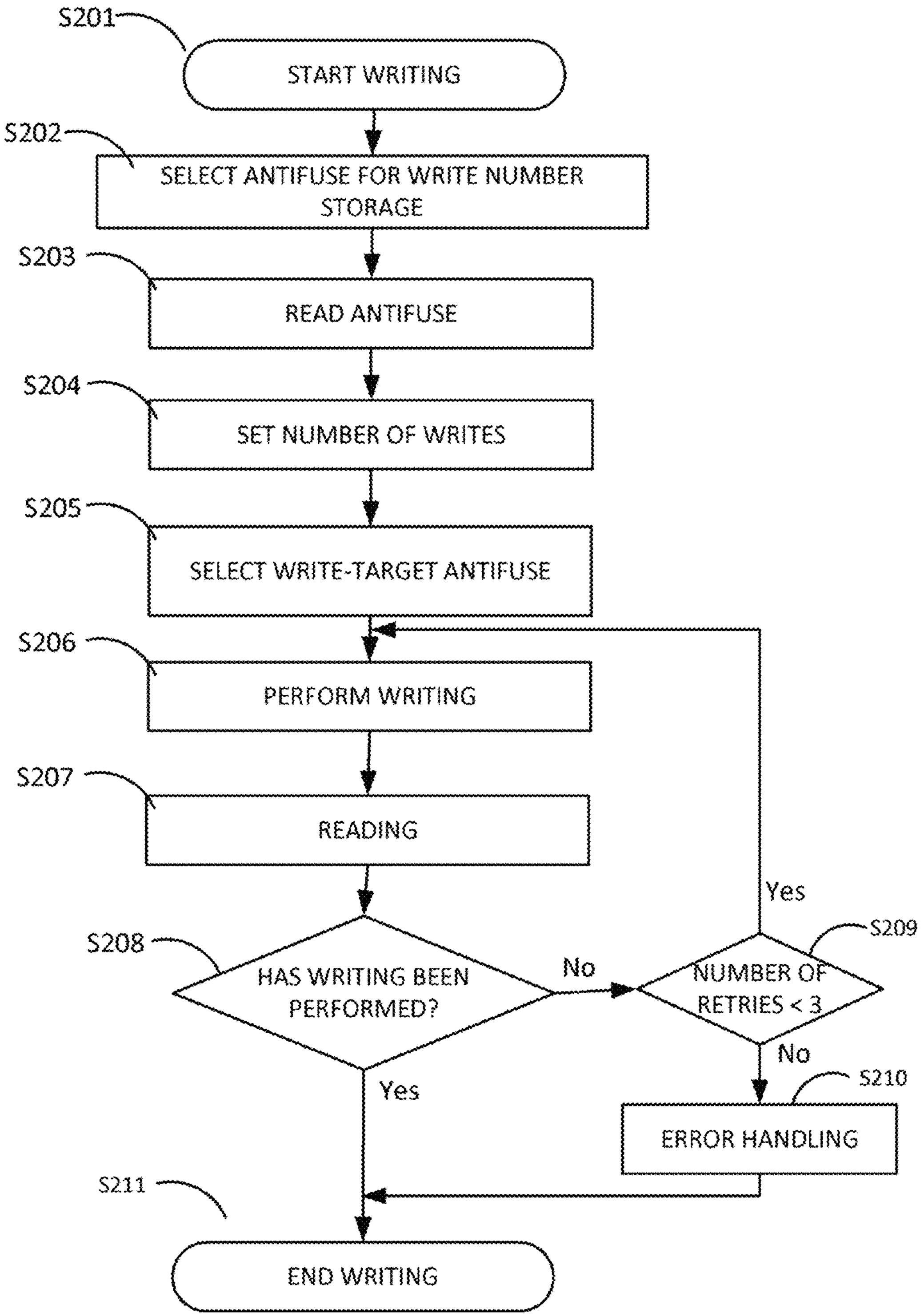
FIG. 5 is a flowchart illustrating a write operation according to Embodiment 1.

FIG. 5 is a flowchart illustrating the write operation according to Embodiment 1. In step S201, the write operation is started. Next, in step S202, the selector circuit 27 is switched such that the antifuse 10 in the write pulse number storage area 20 is selected. Next, in step S203, the state of the antifuse 10 in which the set value of the number of pulses is written is read. After the information about the number of write pulses has been read, the number of write pulses is set in step S204.

When the write operation is performed, first, in step S205, the selector circuit 27 selects the target antifuse 10. Next, in step S206, the write operation is performed on the antifuse 10 with the set number of write pulses. Next, in step S207, the read operation is performed on the antifuse 10 on which the write operation has been performed. Next, in step S208, it is determined whether or not there is a change in the state (whether or not writing has been performed) based on the contents read from the antifuse 10.

If it is determined that there is no change in the state of the antifuse element Ca (no writing has been performed) (S208=No), the processing proceeds to step S209. In step S209, the number of retries is checked. If the number of retries is less than three times (S209=Yes), the application of the set number of pulses (S206), the read operation (S207), and the determination of the presence or absence of a change in the state (S208) are performed again. If it is determined that the number of retries is three times or more (S209=Yes), the processing proceeds to step S210, and error handling is performed. Next, the processing ends in step S211. If it is determined in step S208 that a change in the state has occurred (writing has been performed) (Yes), the processing directly proceeds to step S211 and ends.

As described above, according to the present embodiment, before the pulses are applied to the antifuse element Ca, the number of write pulses to be applied to the antifuse element Ca is determined in accordance with the flowchart in FIG. 3. Therefore, the optimum number of pulses can be supplied to the write-target antifuse element Ca. In this way, the write time will not be prolonged, which leads to the reduction of the processing time.

Embodiment 2

Next, Embodiment 2 will be described. The same reference numerals are given to the same components and operations as those in Embodiment 1, and description thereof may be simplified.

Constituent Blocks

Figure 6:
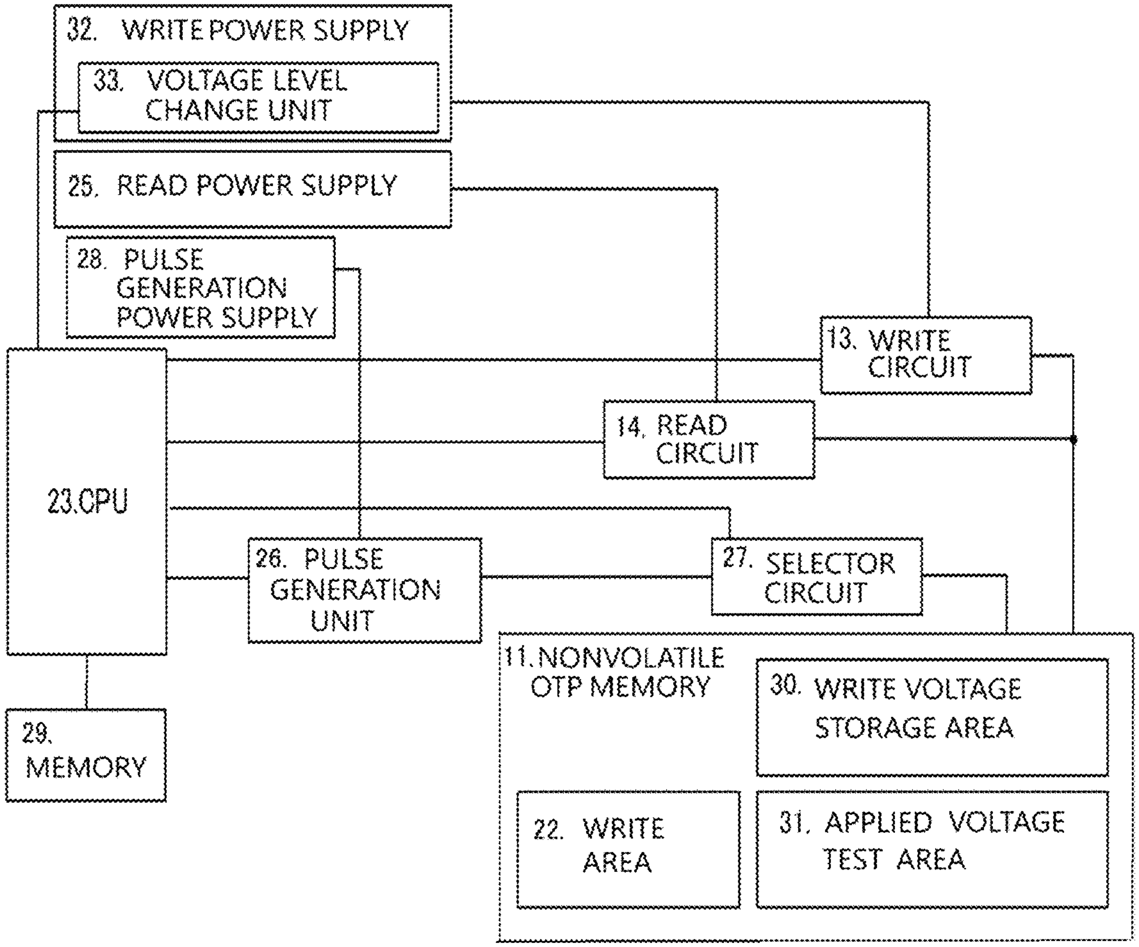
FIG. 6 is a diagram illustrating constituent blocks for write voltage determination according to Embodiment 2.

FIG. 6 is a diagram illustrating constituent blocks for determining the write voltage according to Embodiment 2. In a nonvolatile OTP memory 11 according to Embodiment 2, too, write conditions such as the write time, the write voltage, and the number of writes are set. The nonvolatile OTP memory 11 according to Embodiment 2 includes a write voltage storage area 30 for storing the write voltage, which is one of the write conditions, an applied voltage test area 31, and a write area 22. The applied voltage test area 31 has a plurality of antifuse elements Ca, and the antifuse element Ca to be inspected can be changed for each test voltage.

A write circuit 13 is connected to a CPU 23 and a write power supply 32. A read circuit 14 is connected to the CPU 23 and a read power supply 25. The CPU 23 controls switching of the circuits when writing/reading is performed. When writing is performed, a high voltage is applied from the write power supply 32, and when reading is performed, a weak current is supplied from the read power supply 25.

The write power supply 32 of Embodiment 2 includes a voltage level change unit 33, and the voltage value can be changed by the CPU 23. A selector circuit 27 selects the write-target/read-target antifuse 10 by switching the connection to a gate terminal of a transistor 12 corresponding to the write-target/read-target antifuse 10. The selector circuit 27 is connected to a pulse generation unit 26, and pulse signals are applied to the gate terminal of the transistor 12 via the selector circuit 27.

The selector circuit 27 is connected to the CPU 23, and the CPU 23 can control the switching to the transistor 12 corresponding to the target antifuse 10. The pulse generation unit 26 is connected to a pulse generation power supply 28 and the CPU 23, and it can generate pulse signals by being controlled by the CPU 23. The CPU 23 is also connected to a memory 29 including a nonvolatile memory (for example, a ROM) and a volatile memory (for example, a RAM). The memory 29 of Embodiment 2 stores a table of correlations between write voltages and write bits.

Write Voltage Determination Flow

Figure 7:
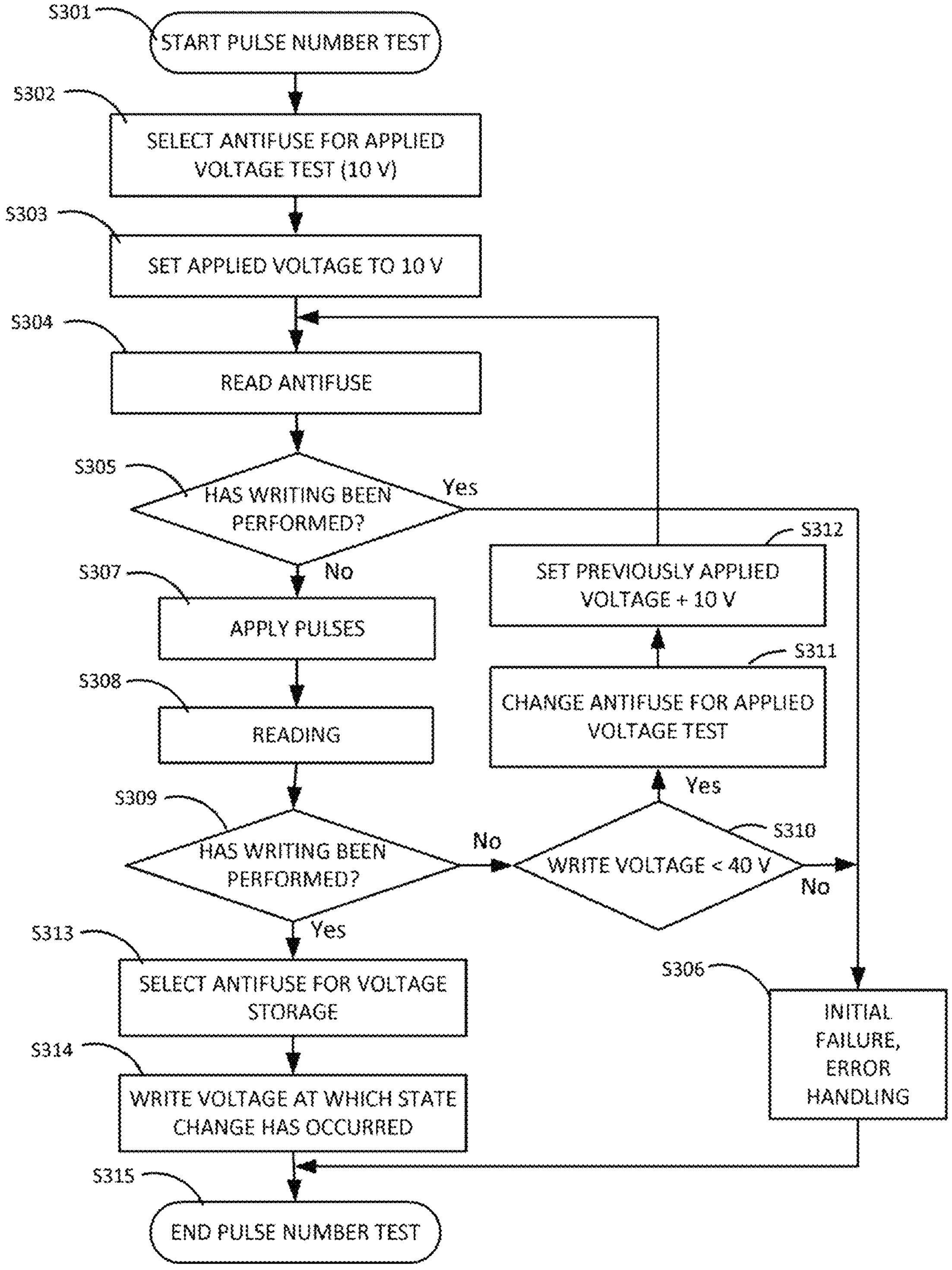
FIG. 7 is a flowchart illustrating the write voltage determination according to Embodiment 2.

FIG. 7 is a flowchart illustrating write voltage determination according to Embodiment 2. In step S301, a write voltage test is started. Next, in step S302, the selector circuit 27 is switched such that the antifuse 10 for 10 V test in the write voltage storage area 30 is selected. Next, in step S303, the write voltage is set to 10 V. Next, in step S304, the state of the antifuse 10 is read. Next, in step S305, the read state of the antifuse 10 is checked (whether or not writing has been performed).

If it is determined by the check in step S305 that the read value is at a level that is assumed to represent the state after writing, the processing proceeds to step S306. In step S306, it is determined that there is an initial failure, and error handling is performed. If the state of the antifuse 10 read in step S305 is at a level that is assumed to represent the state before writing, the processing proceeds to step S307. In step S307, predetermined pulses are applied at 10 V. Next, in step S308, the state of the antifuse 10 is read again. Next, in step S309, it is checked whether or not there is a change in the read state of the antifuse 10.

If it is determined by the check in step S309 that there is no change in the state (no writing has been performed), the processing proceeds to step S310. In step S310, it is determined whether or not the current set value of the write voltage is smaller than a certain voltage (in this case, 40 V). If the current set value is smaller than the predetermined voltage (S310=Yes), the processing proceeds to step S311, and the antifuse 10 in the applied voltage test area 31 is changed. Next, the processing proceeds to step S312, and the write voltage is increased (in this case, +5 V). Thereafter, the flow from step S304 to step S309 is repeated.

The above process is repeated until the write voltage reaches the predetermined value (in this case, 40 V). If the state of the antifuse 10 does not change even when the write voltage becomes equal to or more than the predetermined value (S310=No), the processing proceeds to step S306, and in step S306, it is determined that there is an initial failure, and error handling is performed.

If it is determined that there is a change in the state of the antifuse 10 (the write operation has been completed normally) as a result of applying the write voltage, which is increased by 5 V at each application (S309=Yes), the processing proceeds to step S313. In step S313, the selector circuit 27 is switched to the write voltage storage area 30. Next, in step S314, the voltage at which the change in the state of the antifuse 10 has occurred is written. Next, in step S315, the processing ends.

The write/read operations according to Embodiment 2, which are performed in accordance with the applied voltage determined in this way, will be described. As described with reference to FIG. 6, the nonvolatile OTP memory 11 includes the write voltage storage area 30 for storing the write voltage, which is one of the write conditions, the applied voltage test area 31, and the write area 22, and is connected to the write circuit 13 and the read circuit 14 via the input A illustrated in FIG. 1. The write circuit 13 is connected to the CPU 23 and the write power supply 32, and the read circuit 14 is connected to the CPU 23 and read power supply 25. The CPU 23 controls the switching between the write and read circuits. When writing is performed, a high voltage is applied from the write power supply 32, and when reading is performed, a weak current is supplied from the read power supply 25.

The write power supply 32 can change the voltage value by using the voltage level change unit 33 in accordance with a signal from the CPU 23. The selector circuit 27 selects the write-target/read-target antifuse 10 by switching the connection to the gate terminal of the transistor 12 corresponding to the write-target/read-target antifuse 10. The selector circuit 27 is connected to the pulse generation unit 26, and pulse signals are applied to the gate terminal of the transistor 12 via the selector circuit 27. The selector circuit 27 is connected to the CPU 23, and the CPU 23 can control the switching to the transistor 12 corresponding to the target antifuse 10. The pulse generation unit 26 is connected to the pulse generation power supply 28 and the CPU 23, and it can generate pulse signals by being controlled by the CPU 23. The CPU 23 is also connected to the memory 29 including a nonvolatile memory (for example, a ROM) and a volatile memory (for example, a RAM). The memory 29 stores a table of correlations between write voltages and write bits.

Write Operation Processing Flow

Figure 8:
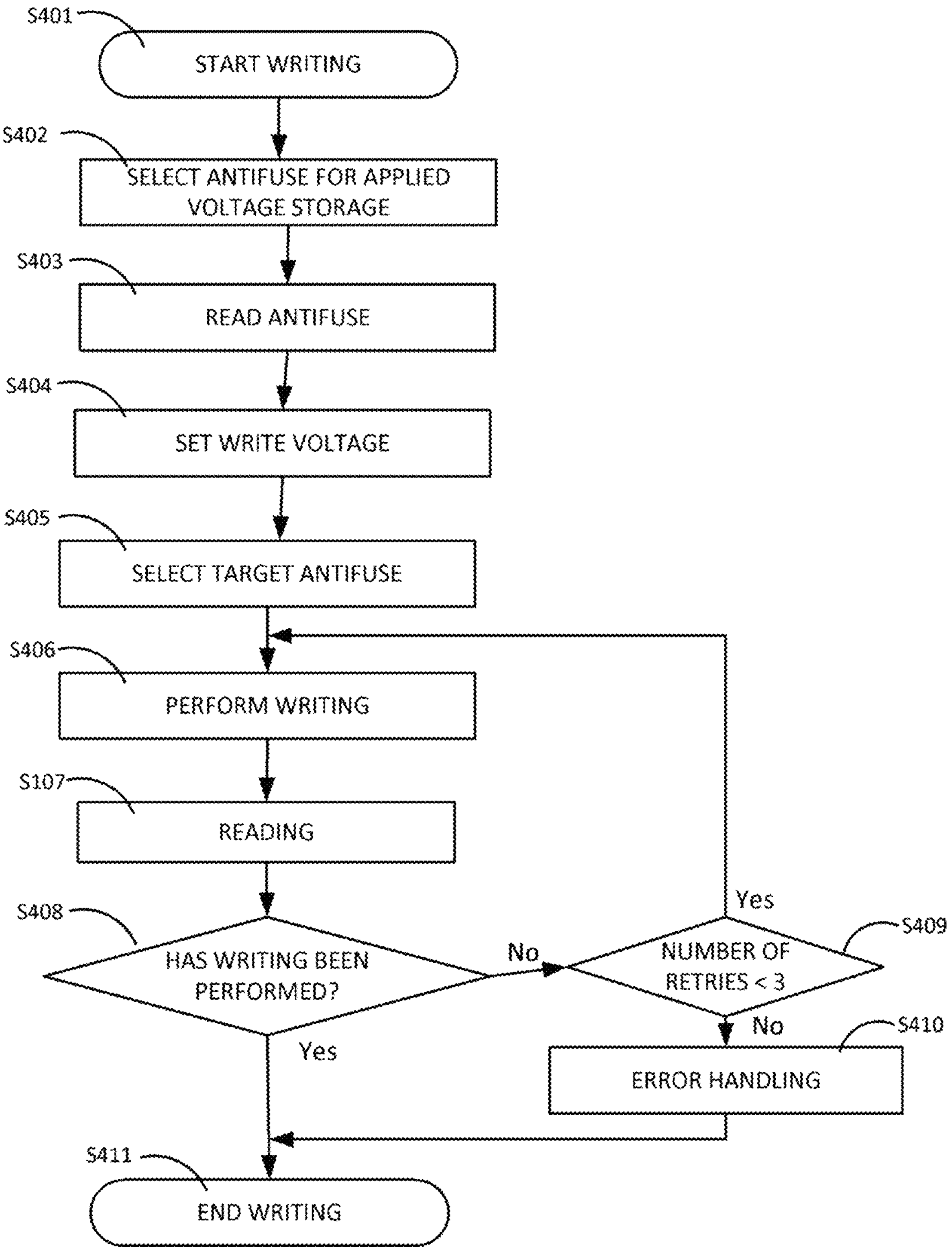
FIG. 8 is a flowchart illustrating a write operation according to Embodiment 2.

FIG. 8 is a flowchart illustrating the write operation according to Embodiment 2. In step S401, the write operation is started. Next, in step S402, the selector circuit 27 is switched such that the antifuse 10 in the write voltage storage area 30 is selected. Next, in step S403, the state of the antifuse 10 in which the set value of the applied voltage is written is read. After the write voltage information has been read, the write voltage is set in step S404.

When the write operation is performed, first, in step S405, the selector circuit 27 selects the target antifuse 10. Next, in step S406, the write operation is performed on the antifuse 10 at the set write voltage. Next, in step S407, the read operation is performed on the antifuse 10 on which the write operation has been performed. Next, in step S408, it is determined whether or not there is a change in the state (whether or not writing has been performed) based on the contents read from the antifuse 10.

If it is determined that there is no change in the state of the antifuse element Ca (no writing has been performed) (S408=No), the processing proceeds to step S409. In step S409, the number of retries is checked. If the number of retries is less than three times (S409=Yes), the application of the voltage at the set value (S406), the read operation (S407), and the determination of the presence or absence of the change in the state (S408) are performed again. If it is determined that the number of retries is three times or more (S409=No), the processing proceeds to step S410, and error handling is performed. Next, the processing ends in step S411. If it is determined in step S408 that a change in the state has occurred (writing has been performed) (Yes), the processing directly proceeds to step S411 and ends.

As described above, according to the present embodiment, the write voltage is appropriately set before the voltage is applied to the antifuse element Ca. In this way, the write time will not be prolonged, which leads to the reduction of the processing time.

Embodiment 3

Next, Embodiment 3 will be described. The same reference numerals are given to the same components and operations as those in Embodiments 1 and 2, and description thereof may be simplified.

Constituent Blocks

Figure 9:
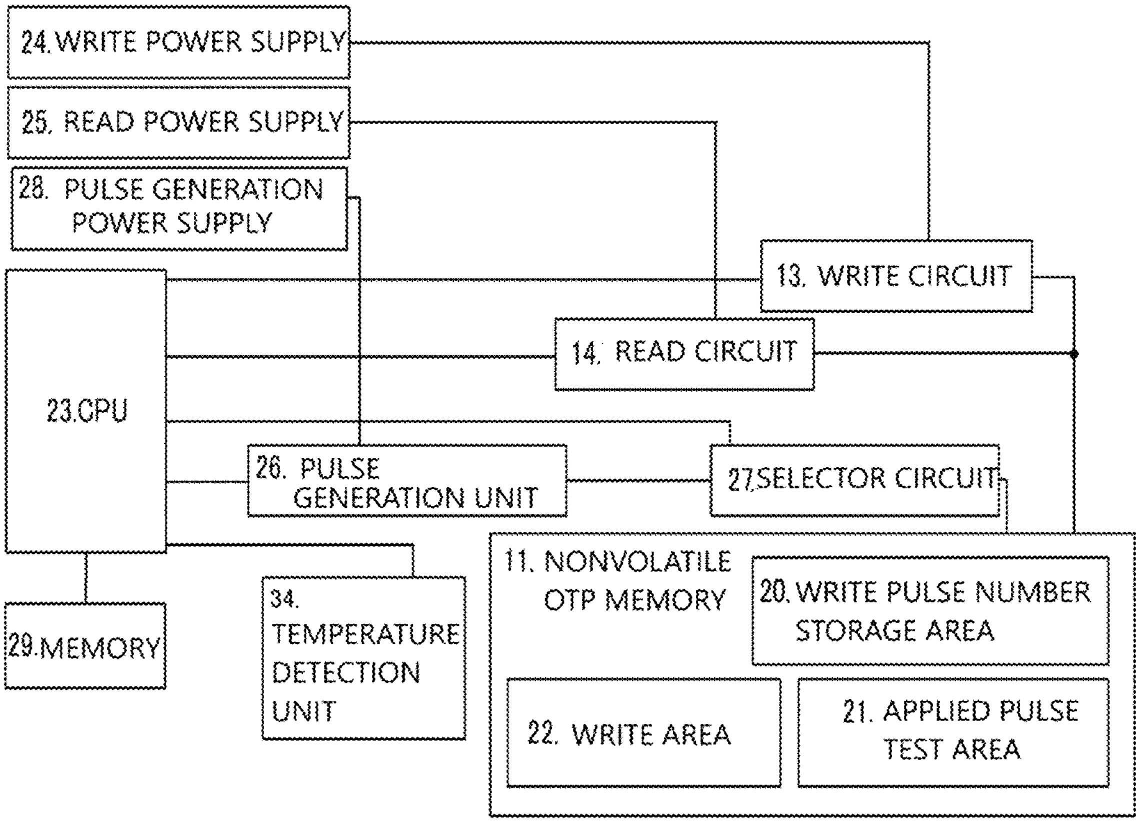
FIG. 9 is a diagram illustrating constituent blocks for a write operation according to Embodiment 3.

FIG. 9 is a diagram illustrating constituent blocks for a write operation according to Embodiment 3. In a nonvolatile OTP memory 11 according to Embodiment 3, too, write conditions such as the write time, the write voltage, and the number of writes are set. The nonvolatile OTP memory 11 according to Embodiment 3 includes a write pulse number storage area 20 for storing the number of writes, which is one of the write conditions, an applied pulse number test area 21, and a write area 22. The nonvolatile OTP memory 11 is connected to a write circuit 13 and a read circuit 14 via the input A illustrated in FIG. 1.

The write circuit 13 is connected to a CPU 23 and a write power supply 24. The read circuit 14 is connected to the CPU 23 and a read power supply 25. The CPU 23 controls switching of the circuits when writing/reading is performed. When writing is performed, a high voltage is applied from a write power supply 24, and when reading is performed, a weak current is supplied from a read power supply 25. A selector circuit 27 selects a write-target/read-target antifuse 10 by switching the connection between a gate terminal of a transistor 12 connected to the output B illustrated in FIG. 1 and a pulse generation unit 26. The selector circuit 27 is connected to the pulse generation unit 26 and the CPU 23, and it is controlled by the CPU 23. The pulse generation unit 26 is connected to a pulse generation power supply 28 and the CPU 23, and can generate pulse signals a desired number of times by being controlled by the CPU 23.

In Embodiment 3, a temperature detection unit 34 connected to the CPU 23 is provided near the nonvolatile OTP memory 11. The temperature detection unit 34 may be any type of temperature detector as long as the temperature detector can detect the temperature. For example, a temperature sensor made of a diode can be used. It is preferable that the temperature detection unit 34 be disposed near the nonvolatile OTP memory. Specifically, it is preferable that the temperature detection unit 34 be disposed close enough to the nonvolatile OTP memory to be able to detect a temperature change with the required accuracy. The CPU 23 is connected to a memory 29. The memory 29 stores a table of correlations between temperatures and the numbers of write pulses as illustrated in FIG. 11, in addition to the table of correlations between write pulses and write bits as illustrated in FIG. 4. In this way, the CPU 23 can generate the number of pulses based on the information from the write pulse number storage area 20 and the temperature information detected by the temperature detection unit 34.

Write Operation Processing Flow

Figure 10:
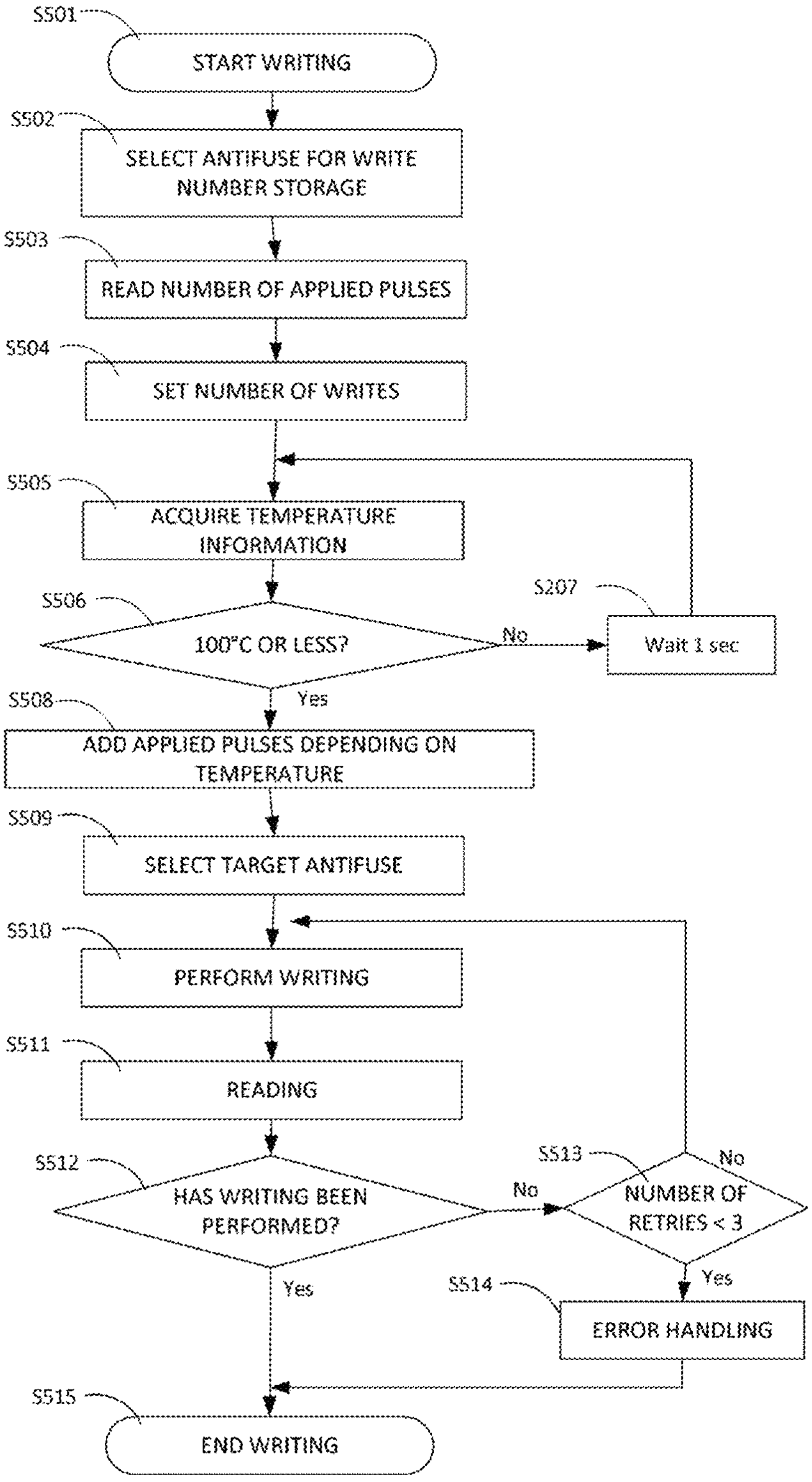
FIG. 10 is a flowchart illustrating the write operation according to Embodiment 3.

FIG. 10 is a flowchart illustrating the write operation according to Embodiment 3 of the present invention. In step S501, the write operation is started. Next, in step S502, the selector circuit 27 is switched such that the antifuse 10 in the write pulse number storage area 20 is selected. Next, in step S503, the state of the antifuse 10 in which the set value of the number of pulses is written is read. After the information on the number of write pulses has been read, the number of write pulses is set in step S504.

It is known that, due to the characteristics of the antifuse, the higher the temperature of the antifuse becomes, the less likely the state of the antifuse changes, and when the temperature exceeds a certain threshold, the antifuse cannot be activated regardless of the number of pulses. Thus, in Embodiment 3, in step S505, the temperature detection unit 34 disposed near the antifuse element Ca detects the temperature of the antifuse 10 to acquire temperature information. Next, in step S506, it is determined whether the temperature exceeds a predetermined threshold (in this case, 100° C.) or is equal to or lower than the threshold.

If the temperature exceeds the threshold (S506=No), the processing proceeds to step S507, and wait control for a certain time (in this case, 1 second) is performed to lower the temperature. After the wait control finishes, the temperature information is acquired (S505), and the determination is performed (S506) again. If the temperature information is equal to or less than the threshold (S506=Yes), the processing proceeds to step S508. In step S508, the number of additional pulses to be applied is determined by referring to a table of temperatures and the number of additional pulses as illustrated in FIG. 11.

When the write operation is performed, first, in step S509, the selector circuit 27 selects a target antifuse 10. Next, in step S510, the write operation is performed on the antifuse 10 with the set number of write pulses. Next, in step S511, the read operation is performed on the antifuse 10 on which the write operation has been performed. Next, in step S512, it is determined whether or not there is a change in the state (whether or not writing has been performed) based on the contents read from the antifuse 10.

If it is determined that there is no change in the state of the antifuse element Ca (no writing has been performed), the processing proceeds to step S513. In step S513, the number of retries is checked. If the retry has been performed less than three times (S513=Yes), the write operation (S510), the read operation (S511), and the determination of the presence or absence of a change in the state (S512) are performed again. If it is determined that the retry has been performed three times or more (S513=Yes), the processing proceeds to step S514, and error handling is performed. Next, the processing ends in step S515. If it is determined in step S512 that a change in the state has occurred (writing has been performed) (Yes), the processing directly proceeds to step S515 and ends.

As described above, according to the present embodiment, the environmental temperature is measured before the pulses are applied to the antifuse element Ca, and the number of write pulses applied to the antifuse element Ca is determined by referring to the detected temperature information. Therefore, the optimum number of pulses can be supplied to the write-target antifuse element Ca. In this way, the write time will not be prolonged, which leads to the reduction of the processing time. In the present embodiment, the temperature information is combined with the determination of the number of pulses. However, the temperature information may be combined with the control of the magnitude of the voltage.

Embodiment 4

Next, Embodiment 4 will be described. The same reference numerals are given to the same components and operations as those in Embodiments 1 to 3, and description thereof may be simplified. In Embodiment 4, a liquid ejection apparatus to which the storage device of any one of the above-described embodiments is applied will be described.

Figure 12:
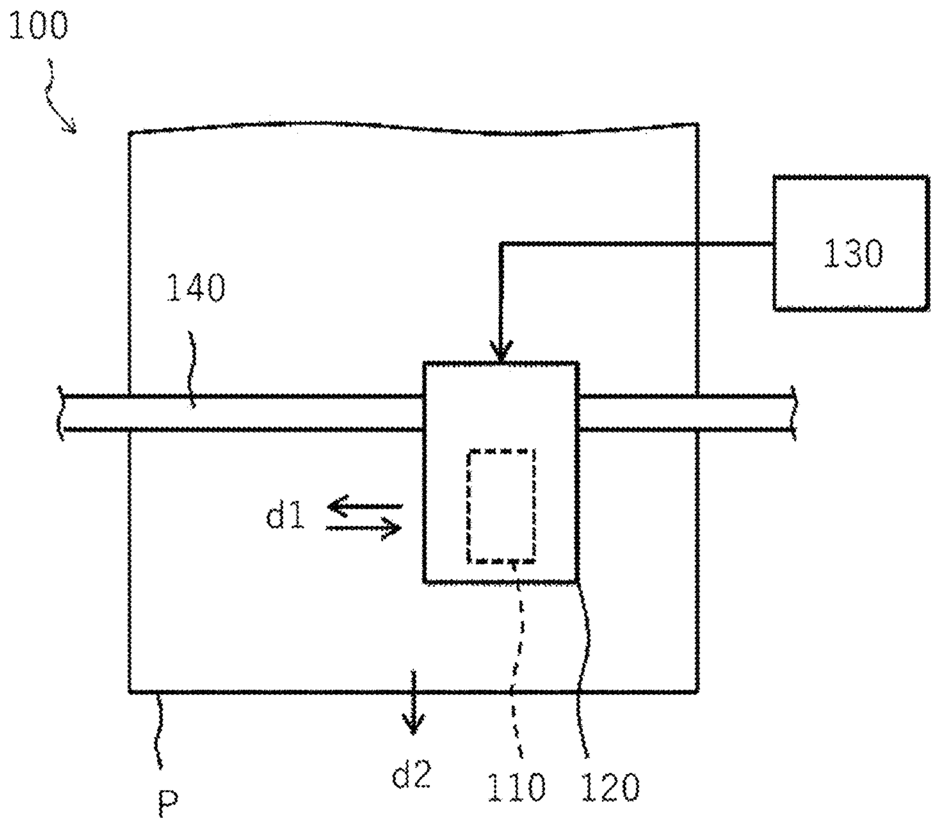
FIG. 12 is a diagram schematically illustrating a liquid ejection apparatus according to Embodiment 4.

FIG. 12 is a diagram schematically illustrating an example of an overall configuration of an inkjet liquid ejection apparatus 100 (recording apparatus) according to Embodiment 4. The liquid ejection apparatus 100 includes a liquid ejection head 110 (recording head), a carriage 120, and a controller 130 serving as a control unit that performs drive control of the liquid ejection head 110 and the carriage 102.

The liquid ejection head 110 is provided with a plurality of nozzles (ejection ports) for ejecting liquid such as ink. The liquid ejection head 110 includes a semiconductor substrate (recording element substrate) on which a plurality of liquid ejection elements corresponding to the plurality of nozzles are provided. The liquid ejection head 110 drives each liquid ejection element based on a control signal from the controller 130. As a result, ink is ejected from the corresponding nozzle, and desired recording is performed on a recording medium P. The recording medium P is typically a sheet-like paper material. However, the recording medium P is not limited thereto.

The carriage 120 supporting the liquid ejection head 110 reciprocates in the direction of an arrow d1 along a guide 140 based on a control signal from the controller 130. The recording medium P is conveyed in a direction d2 by a conveyance mechanism of the liquid ejection apparatus 100. The controller 130 controls the driving of the liquid ejection head 110 while reciprocating the carriage 120 so that a desired image can be recorded on the recording medium P.

Figure 13:
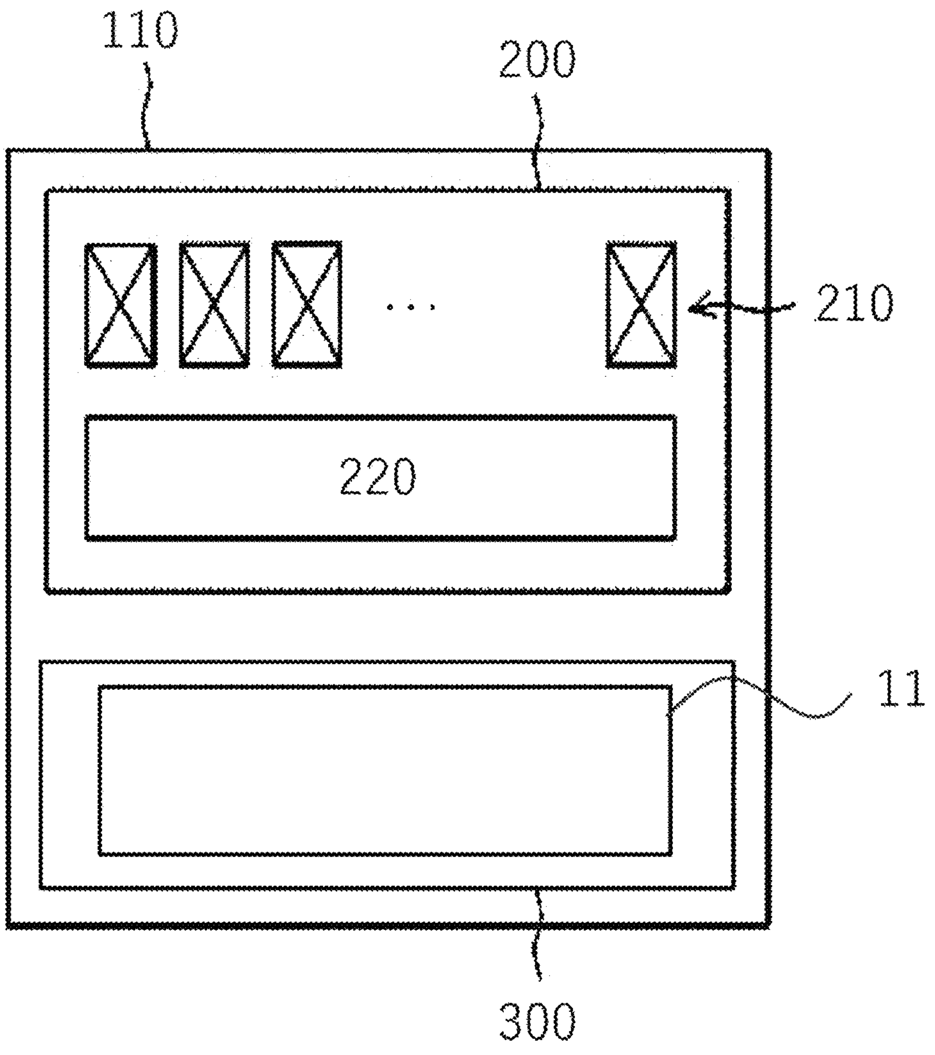
FIG. 13 is a diagram schematically illustrating a configuration of a liquid ejection head according to Embodiment 4.

FIG. 13 is a diagram schematically illustrating an example of a configuration of the liquid ejection head 110. The liquid ejection head 110 includes a functional unit 200 for realizing a recording function, which is a main function, and a storage device 300 capable of storing predetermined information. The functional unit 200 and the storage device 300 may be provided on the same semiconductor substrate or different semiconductor substrates.

The functional unit 200 includes a plurality of liquid ejection elements 210 (recording elements) and an element driving unit 220 capable of individually driving the plurality of liquid ejection elements 210. As a driving source of the liquid ejection element 210, a heater element, an electrothermal conversion element, a piezoelectric element, or the like is suitable. However, the driving source is not limited thereto. The storage device 300 can store unique information about the liquid ejection head 110. Examples of the unique information items include an identifier, a serial number, unique parameters, etc. The storage device 300 includes the nonvolatile OTP memory 11. In addition, the storage device 300 may include at least a part of the circuits related to the control and the reading/writing of the nonvolatile OTP memory 11 as described in the above embodiments.

The liquid ejection apparatus 100 according to the present embodiment can reduce the time needed for image recording since the write time to the nonvolatile OTP memory 11 having antifuse elements Ca will not be prolonged.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-203879, filed on Dec. 1, 2023, which is hereby incorporated by reference wherein in its entirety.

What is claimed is:

1. A storage device comprising:

a memory unit having an antifuse element, the memory unit including a write condition storage area that stores a write condition and a write area in which information is written; and a control unit configured to perform a write operation and a read operation on the memory unit by controlling voltage applied to the antifuse element, the control unit applying a write voltage in a form of pulses having a constant cycle to the antifuse element in the write operation, wherein the control unit controls the write condition by referring to the write condition storage area in the write operation.

2. The storage device according to claim 1, wherein the memory unit further includes a test area used for a test to determine the write condition, and the control unit determines the write condition based on a result of applying the write voltage to the antifuse element in the test area and stores the determined write condition in the write condition storage area.

3. The storage device according to claim 2, wherein the control unit applies the write voltage to the antifuse element in the test area while changing the write condition and stores, in the write condition storage area, the write condition under which the write operation to the antifuse element is completed normally.

4. The storage device according to claim 1, wherein the write condition is a number of pulses of the write voltage applied to the antifuse element.

5. The storage device according to claim 1, wherein the write condition is a magnitude of the write voltage applied to the antifuse element.

6. The storage device according to claim 2, further comprising a temperature detection unit configured to detect temperature information on the memory unit, wherein the control unit determines the write condition based on the temperature information.

7. The storage device according to claim 6, wherein the control unit performs wait control for lowering temperature when the temperature information exceeds a predetermined threshold in the write operation.

* * * * *